(12) United States Patent
Duane et al.

(10) Patent No.: US 6,639,253 B2
(45) Date of Patent: Oct. 28, 2003

(54) OVERVOLTAGE PROTECTION DEVICE

(75) Inventors: Russell Duane, Wilton (IE); Jeremy Paul Smith, Wollaston (GB); Steven Wilton Byatt, Bromham (GB)

(73) Assignee: Bourns Limited, Bedford (GB)

( * ) Notice: Subject to any disclaimer, the term of this patent is extended or adjusted under 35 U.S.C. 154(b) by 0 days.

(21) Appl. No.: 10/117,529

(22) Filed: Apr. 4, 2002

(65) Prior Publication Data

US 2002/0185645 A1 Dec. 12, 2002

(51) Int. Cl.$^7$ .................. H01L 29/74; H01L 31/111
(52) U.S. Cl. ................................................ 257/111
(58) Field of Search ............................. 257/355, 110, 257/111, 112, 132, 173, 174, 120, 107, 155, 156, 162, 168, 169, 170, 154, 171, 172, 177, 178

(56) References Cited

U.S. PATENT DOCUMENTS 5,001,537 A * 3/1991 Colman et al. ............... 357/38

FOREIGN PATENT DOCUMENTS

| EP | 0645823 | 3/1995 |
|---|---|---|
| EP | 0700099 | 3/1996 |
| GB | 2205685 | 12/1988 |

* cited by examiner

*Primary Examiner*—Wael Fahmy
*Assistant Examiner*—Dana Farahani
(74) *Attorney, Agent, or Firm*—Klein, O'Neill & Singh, LLP

(57) ABSTRACT

A semiconductor overvoltage protection device in the form of a four layer diode has first and third layers of a first conductivity semiconductor material, second and fourth layers of a second conductivity type semiconductor material and a first buried region of the first conductivity type in the third layer adjacent to the junction between the second and third layers. The buried region has a greater impurity concentration than the third layer. The first layer is penetrated by a plurality of dots of the second layer extending through the first layer and the first buried region lies wholly beneath the second layer and is laterally offset from the dots and the first layer.

10 Claims, 2 Drawing Sheets

OVERVOLTAGE PROTECTION DEVICE

BACKGROUND OF THE INVENTION

1. Field of the Invention

The present invention relates to an overvoltage protection device.

2. Description of the Prior Art

There are in existence a wide range of semiconductor devices which are designed to protect telecommunications equipment from overvoltages which can occur on telephone lines as a result of, for example, lightening strikes and AC power surges. Many of these semiconductor devices are based on a four layer PNPN structure which is designed to switch quickly from a blocking state to a high conduction state when the voltage across the device exceeds a predetermined threshold level.

GB-A-2 113 907 describes a four layered diode (PNPN) semiconductor device which is usable as a transient suppressor because it switches from a high resistance condition to a low resistance condition when the current through it reaches a threshold value. The device has a thyristor type structure with a controlled holding current and an additional buried N-region through which reverse breakdown of the central junction of the structure takes place to control the initial avalanche breakover voltage.

This buried region is of the same conductivity type as the region in which it is formed and has a greater impurity concentration than that region. The effect of the buried region is to cause the reverse voltage breakdown through the central junction to take place through the buried region. This enables the breakdown voltage of the device to be controlled more accurately than is the case in a conventional four layer diode. Although it is not shown in GB-A-2 113 907, the outer layer which acts as the emitter has a number of perforations or dots through it where the material of the adjacent inner layer reaches the surface. The metal contact at the surface produces a resistive short circuit across the junction between the outer and inner layers serving to define the holding current of the device.

In the structure described above the avalanche occurs uniformly across the buried region. The resulting current forward biases the anode-substrate junction. Similarly, the avalanche current flows via the shorting dots causing a resistive voltage drop thus forward biassing the base-cathode junction and causing the device to latch. Suitable choice of shorting geometry helps to avoid localised switching of the base-cathode junction.

Among the many important characteristics of an overvoltage protection device are the peak voltage before switching occurs, known as the breakover voltage $V_{BO}$, and the maximum voltage below which the device should be operated under normal conditions, known as the forward repetitive maximum voltage $V_{DRM}$. The difference between $V_{BO}$ and $V_{DRM}$ represents a reduction in the size of the safe voltage window for the equipment and therefore the ratio of $V_{BO}$ to $V_{DRM}$ should be as close to unity as is possible in order to maximise the operating window for the equipment being protected.

The ability to control the turn on characteristics of such a device not only improves the system protection which the device can provide but in certain applications can improve the power dissipation capability of the device.

BRIEF SUMMARY OF THE INVENTION

It is an object of the present invention to provide an improved semiconductor overvoltage protection device.

Accordingly, the present invention provides a semiconductor overvoltage protection device in the form of a four layer diode having: first and third layers of a first conductivity semiconductor material; second and fourth layers of a second conductivity type semiconductor material; a first buried region of the first conductivity type in the third layer adjacent to the junction between the second and third layers, the buried region having a greater impurity concentration than the third layer so that reverse breakdown of the junction preferentially occurs through said first buried region; wherein: said first layer is penetrated by a plurality of dots of said second layer extending through said first layer; and said first buried region lies wholly beneath said second layer and is laterally offset from said dots and said first layer.

In a preferred form of the invention a second buried region is provided in said third layer adjacent the junction between said second layer and said third layer, said second buried region being of the same conductivity type as and of lower impurity concentration than said first buried region and having a greater impurity concentration than said third layer.

Preferably, the ratio of impurity concentration in said first and second buried regions is such that the breakdown voltage between said second layer and said second buried region exceeds the breakdown voltage between said second layer and said first buried region by no more than 5%.

Advantageously, said first buried region extends along at least a portion of the periphery of said second layer.

Advantageously, said first buried region is formed by a plurality of discrete regions.

Preferably, said first buried region has an impurity concentration corresponding to a desired breakover voltage of the device.

Advantageously, the breakover current of the device is controlled by the position of the first buried region relative to said dots.

Preferably, said first buried region is patterned geometrically beneath the layer such that said first buried region has an impurity concentration which peaks at a point which is laterally displaced from the centres of the shorting dots.

BRIEF DESCRIPTION OF THE DRAWINGS

The present invention is further described hereinafter, with reference to the accompanying drawings, in which.

DETAILED DESCRIPTION

Figure 1:
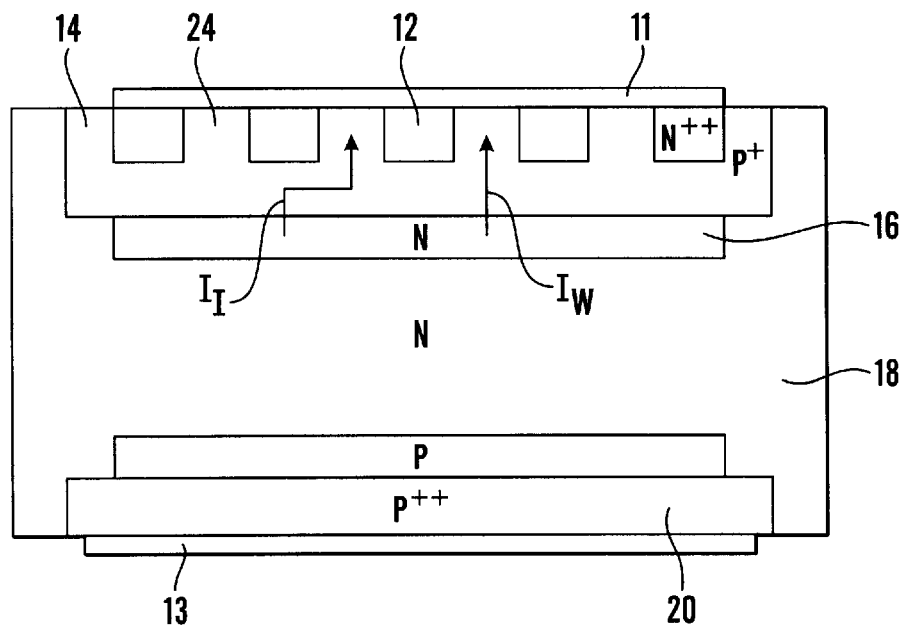
FIG. 1 shows in diagrammatic form one example of a conventional four layer (PNPN) diode.

FIG. 1 is one example of a conventional four layer (PNPN) diode 10 which has a cathode region 12 of highly doped N-type conductivity in a base region 14 of less highly doped but still heavily doped P-type conductivity. A heavily doped buried region 16, referred to as a blanket pad, of N-type conductivity is formed beneath the base region 14 at the junction of the base region 14 and a lightly doped region 18 of N-type conductivity which forms the bulk of the semiconductor device.

An anode region 20 of heavily doped P-type conductivity is located on the underside of the region 18. Metallisations 11, 13 are provided on the upper and lower surfaces.

The cathode region 12 is penetrated by a number of small area shorting dots 24 of the material of the base region 14. These are distributed over the area of the junction between the cathode region 12 and the base region 14 to provide a resistor connection across that junction and give the device a relatively high but controlled holding current.

Figure 2:
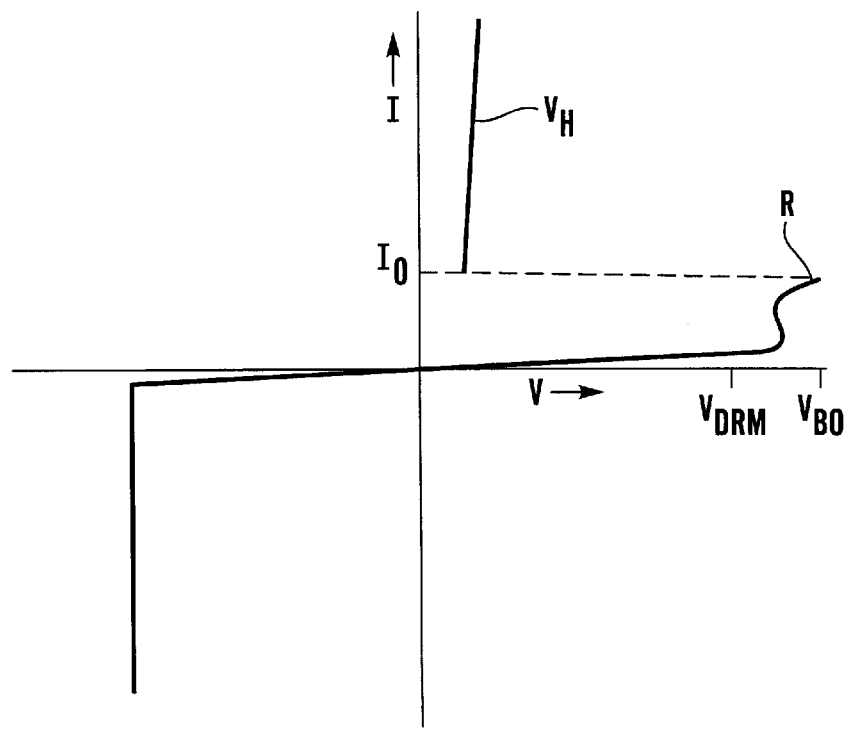
FIG. 2 shows the voltage-current characteristics of the device of FIG. 1.

FIG. 2 shows the voltage-current characteristics of the device of FIG. 1 in which, at a breakover voltage $V_{BO}$ the device switches from a blocking state to a conducting state with a holding voltage $V_H$. It can be seen from FIG. 2 that at the $V_{DRM}$ voltage the current begins to increase towards the breakover current $I_O$ as the breakover voltage approaches $V_{BO}$.

The blanket pad region 16 of the device of FIG. 1 controls the breakover voltage $V_{BO}$ of the device but does not affect the ratio of $V_{BO}$ to $V_{DRM}$. "Indirect" current $I_I$ flows indirectly from the region 16 into and laterally along the region 14 before flowing through the shorting dots 24. This lateral current generates a voltage drop beneath the cathode which acts to forward bias the base-cathode (14, 12) junction and eventually initiates switching. "Waste" current $I_W$, however, passes vertically through region 14 via the shorting dot without contributing significantly to turn on. The current density through the base-blanket pad (14, 16) junction is determined by the area of the blanket pad 16 and is therefore higher than it would be if the only current flowing through the junction were the current $I_I$ which causes the device to switch. Hence the ratio of $V_{BO}$ to $V_{DRM}$ is also higher.

The current voltage characteristics of FIG. 2 exhibit a second positive resistance region R that results in an increased $V_{BO}$ relative to $V_{DRM}$. Hence, the absolute value of breakover voltage is higher than it would be if the effects of the second positive resistance region could be reduced. The effects of the second positive resistance region are enhanced by lattice heating, which can result from high current densities through the device. In the device of FIG. 1 the area of conduction and the current level at breakover are limited by other design constraints and hence the current density at breakover is fixed.

Figure 3:
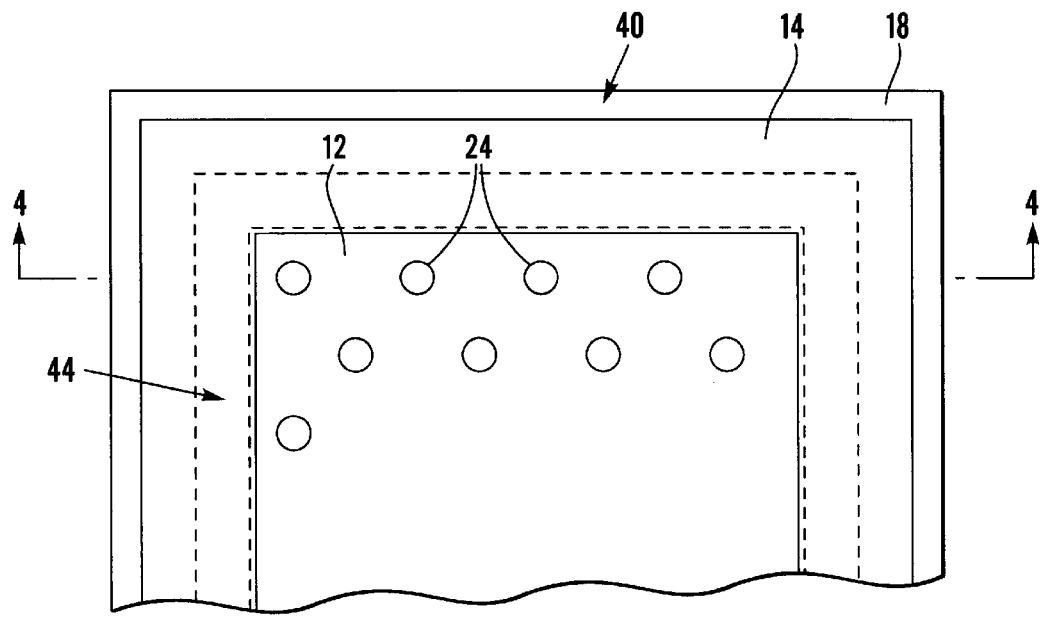
FIG. 3 is a plan view of a part of one embodiment of a semiconductor overvoltage protection device according to the present invention.
Figure 4:
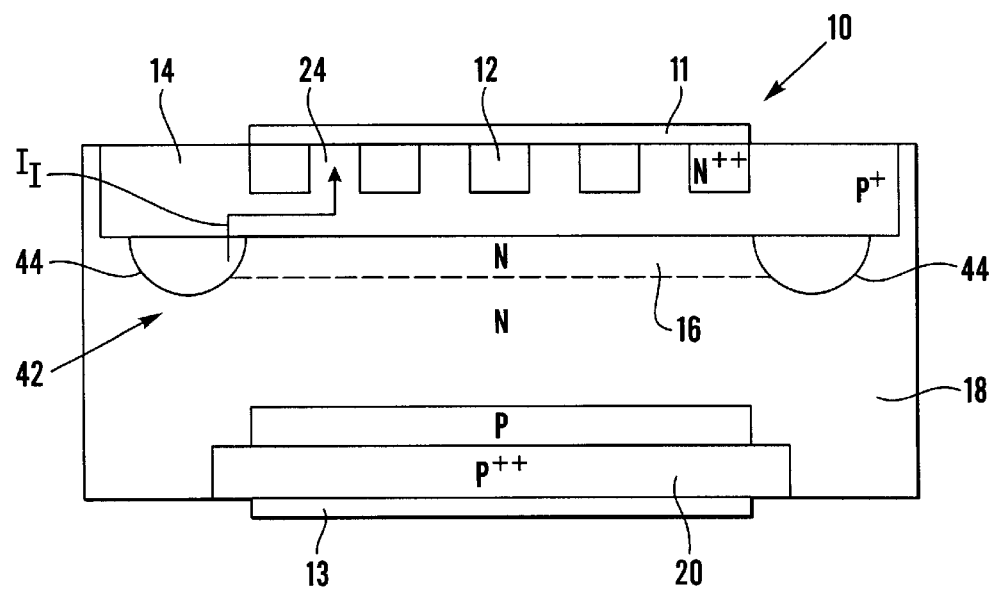
FIG. 4 is a section on the line 4—4 of the device of FIG. 3.

Referring now to FIGS. 3 and 4, these show a preferred embodiment of semiconductor overvoltage protection device according to the present invention which is in the form of a four layer (PNPN) diode 40. This is a modification to the structure of FIG. 1 and like parts are given like reference numbers.

The base region 14 is laterally extended and as can be seen from FIG. 3, a heavily doped buried peripheral region 42 of N-type conductivity is formed beneath the base region 14 at the junction of the base region 14 and the lightly doped region 18. The buried peripheral region 42 is in the form of a peripheral implant region which lies wholly beneath the extended base region 14 and has a peak concentration corresponding to the desired breakdown voltage $V_{BO}$. The peripheral pad implant 42 may be in the form of a single region 44 which completely surrounds the emitter 12 or it may be limited to only part of the emitter periphery. In addition, it may be formed by a number of discrete regions rather than one single region.

The peripheral region 42 is patterned geometrically beneath the region 14 such that the peripheral region 42 has an impurity concentration which peaks at a point which is laterally displaced from the shorting dot centres. FIG. 4 is a plan view of the device of FIG. 3 with the peripheral region 42 showing in relation to the shorting dots 24. In the particular arrangement shown in FIG. 4 the shorting dots 24 are arranged in rows 46 with adjacent rows being offset such that the shorting dots form triangular arrangements, although it will be appreciated that other arrangements could be used. The buried peripheral region 42 is positioned laterally offset from the shorting dots 24 and the cathode region 12.

The surface area of the peripheral region 42 is designed to reduce the current density at breakover without adversely affecting other design parameters. Moving the peripheral region 42 laterally closer to or further from the shorting dots 24 controls the breakover current $I_{BO}$.

As can be seen from FIG. 4, the buried region 44 lies vertically beneath the extended base region 14 and does not lie vertically underneath any of the shorting dots 24 i.e. the cathode. It also does not overlap with or lie vertically beneath the cathode region 12. Because of this, the area or width of the region 44 can be varied as desired to change the device parameters.

The blanket pad region 16 may also be included in the semiconductor device and is shown in dotted lines in FIG. 3. During a fast surge this will assist switching vertically rather than surging through the gated region formed by the peripheral pad implant region 42.

The ratio of impurity concentrations in the blanket pad region 16 and the peripheral region 42 is arranged to provide corresponding breakdown voltages within a few percent (typically 5% or less) of each other with the peripheral region 42 having the lower breakdown voltage. Typically, the concentration of impurities in the peripheral region 42 is $10^{15}$ atoms per cm$^3$. To avoid preferential areas of conduction during switch-on it is desirable to have a uniform doping within the breakdown region.

One example of the device shown in FIG. 3 would have the following doping concentrations:

| Region | Doping material | Peak doping concentration |
| --- | --- | --- |
| Cathode region 12 | Phosphorus | $10^{20}$ |
| Shorting dots 24 | Boron | $5 \times 10^{17}$ |
| Anode region 20 | Boron | $10^{19}$ |
| Blanket pad and implant pad regions 16, 42 | Phosphorus | $10^{15}$ |

One effect of the arrangement of peripheral region 42 in FIG. 3 is to reduce the "waste" current $I_W$ which does not contribute significantly to the turn on current level. As a result, the level of turn on current $I_I$ is increased. Since more of the total current contributes to the turn on current, the characteristic curve of the device between $V_{DRM}$ and $V_{BO}$ increases more sharply, thus reducing the voltage gap between $V_{DRM}$ and $V_{BO}$ and bringing the ratio of $V_{BO}$ to $V_{DRM}$ closer to unity. Additionally, the reduction of the current density at breakover by modification of the peripheral region area helps to reduce the effects of the second positive resistance region and hence the ratio of $V_{BO}$ to $V_{DRM}$ is further reduced.

What is claimed is:

1. A semiconductor overvoltage protection device in the form of a four layer diode comprising:

first and third layers of a first conductivity type semiconductor material, wherein the first layer defines a perimeter;

second and fourth layers of a second conductivity type semiconductor material; and a first buried region of the first conductivity type in the third layer adjacent to a junction between the second and third layers, the first buried region having a greater impurity concentration than the third layer so that reverse breakdown of the junction preferentially occurs through said first buried region;

wherein:

said first layer is penetrated by a plurality of dots of said second layer extending through said first layer; and said first buried region lies wholly beneath said second layer and outside the perimeter defined by said first layer.

2. A semiconductor overvoltage protection device as claimed in claim 1 further comprising a second buried region provided in said third layer adjacent the junction between said second layer and said third layer, said second buried region being of the same conductivity type as and of lower impurity concentration than said first buried region and having a greater impurity concentration than said third layer.

3. A semiconductor overvoltage protection device as claimed in claim 2 wherein the ratio of impurity concentration in said first and second buried regions is such that the breakdown voltage between said second layer and said second buried region exceeds the breakdown voltage between said second layer and said first buried region by no more than 5%.

4. A semiconductor overvoltage protection device as claimed in claim 1 wherein said second layer has a periphery and wherein said first buried region extends along at least a portion of the periphery of said second layer.

5. A semiconductor overvoltage protection device as claimed in claim 1 wherein said first buried region is formed by a plurality of discrete regions.

6. A semiconductor overvoltage protection device as claimed in claim 1 wherein said first buried region has an impurity concentration corresponding to a desired breakover voltage of the device.

7. A semiconductor overvoltage protection device as claimed in claim 1 wherein the device has a breakover current that is controlled by the position of the first buried region relative to the dots.

8. A semiconductor overvoltage protection device as claimed in claim 1 wherein said first buried region is patterned geometrically beneath the second layer such that said first buried region has an impurity concentration which peaks at a point which is laterally displaced from the centers of the dots.

9. A method of fabricating a semiconductor overvoltage protection device as claimed in claim 1, wherein the device has a breakover current, comprising controlling the breakover current by controlling the position of the first buried region relative to said dots.

10. A method of fabricating a semiconductor overvoltage protection device of claim 1 comprising adjusting the impurity concentration of said first buried region thereby to control the desired breakdown voltage of the device.

* * * * *